United States Patent
Kim et al.

(10) Patent No.: US 12,369,455 B2
(45) Date of Patent: Jul. 22, 2025

(54) PIXEL AND DISPLAY APPARATUS

(71) Applicant: Samsung Display Co., Ltd., Yongin-si (KR)

(72) Inventors: Hyunjoon Kim, Yongin-si (KR); Haemin Kim, Yongin-si (KR); Myunghoon Park, Yongin-si (KR); Byungchang Yu, Yongin-si (KR); Donghoon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 533 days.

(21) Appl. No.: 17/731,225

(22) Filed: Apr. 27, 2022

(65) Prior Publication Data

US 2023/0049684 A1 Feb. 16, 2023

(30) Foreign Application Priority Data

Aug. 12, 2021 (KR) .......................... 10-2021-0106938

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 59/121; G09G 3/3266; G09G 3/3233; G09G 3/3225; G09G 3/3275; G09G 2300/0819; G09G 2300/0852; G09G 2300/0861; G09G 2300/0426; G09G 2310/0251; G09G 2310/0262; G09G 2320/043
See application file for complete search history.

(56) References Cited

U.S. PATENT DOCUMENTS

| | | |
|---|---|---|
| 10,102,803 B2 | 10/2018 | Park et al. |
| 10,170,054 B2 | 1/2019 | Park et al. |
| 10,290,258 B2 | 5/2019 | Park et al. |
| 10,650,738 B2 | 5/2020 | Park et al. |
| 10,818,230 B1 * | 10/2020 | Lu ........................ G09G 3/3233 |
| 10,964,264 B1 * | 3/2021 | Kim ..................... G09G 3/3291 |
| 2009/0108763 A1 * | 4/2009 | Han ..................... G09G 3/3233 |
| | | 315/169.3 |
| 2015/0364090 A1 | 12/2015 | Kim et al. |
| 2016/0217735 A1 * | 7/2016 | Park ..................... G09G 3/2003 |
| 2018/0090091 A1 * | 3/2018 | Sim ..................... G09G 3/3688 |

(Continued)

FOREIGN PATENT DOCUMENTS

| | | |
|---|---|---|
| KR | 1020090042006 A | 4/2009 |
| KR | 10-2015-0144396 | 12/2015 |

(Continued)

*Primary Examiner* — Fernando L Toledo
*Assistant Examiner* — Marshall Mu-Nuo Hatfield
(74) *Attorney, Agent, or Firm* — CANTOR COLBURN LLP

(57) ABSTRACT

A pixel that emits light at brightness corresponding to the amount of a driving current regardless of a threshold voltage of a driving transistor, and secure sufficient compensation time by separating an operation of compensating for the threshold voltage of the driving transistor and an operation of writing a data signal, and a display apparatus including the pixel.

20 Claims, 3 Drawing Sheets

(56) References Cited

U.S. PATENT DOCUMENTS

| | | | |
|---|---|---|---|
| 2019/0393291 A1* | 12/2019 | Jeon | G09G 3/3233 |
| 2020/0203456 A1* | 6/2020 | Hyung | H10D 30/0316 |
| 2020/0381507 A1 | 12/2020 | Park et al. | |
| 2021/0035490 A1* | 2/2021 | Feng | G09G 3/32 |
| 2021/0167141 A1 | 6/2021 | Park et al. | |
| 2021/0193788 A1 | 6/2021 | Jo et al. | |
| 2021/0201759 A1* | 7/2021 | Cho | G09G 3/3233 |
| 2021/0358405 A1* | 11/2021 | Yang | G09G 3/3233 |

FOREIGN PATENT DOCUMENTS

| | | |
|---|---|---|
| KR | 10-2016-0063462 | 6/2016 |
| KR | 10-2017-0055584 | 5/2017 |
| KR | 10-2018-0068368 | 6/2018 |
| KR | 10-2019-0083691 | 7/2019 |
| KR | 10-2020-0005706 | 1/2020 |
| KR | 10-2020-0040965 | 4/2020 |
| KR | 10-2020-0139291 | 12/2020 |
| KR | 1020210057629 A | 5/2021 |

\* cited by examiner

PIXEL AND DISPLAY APPARATUS

CROSS-REFERENCE TO RELATED APPLICATION

This claims priority from and the benefit of Korean Patent Application No. 10-2021-0106938, filed on Aug. 12, 2021, which is hereby incorporated by reference for all purposes as if fully set forth herein.

BACKGROUND

Field

Embodiments of the invention relate generally to a pixel and a display apparatus.

Discussion of the Background

An organic light-emitting display apparatus includes a display element of which brightness is changed by a current, for example, an organic light-emitting diode. A pixel of an organic light-emitting display apparatus includes a display element, a driving transistor, and a switching transistor, the driving transistor being configured to control the amount of current supplied to the display element according to a voltage between a gate and a source thereof, and the switching transistor being configured to transfer a data signal controlling the brightness of the display element to the driving transistor.

The above information disclosed in this Background section is only for understanding of the background of the inventive concepts, and, therefore, it may contain information that does not constitute prior art.

SUMMARY

Inventive concepts consistent with one or more embodiments provide for a pixel that may emit light regardless of a threshold voltage of a driving transistor and a display apparatus including the pixel.

Additional features of the inventive concepts will be set forth in the description that follows, and in part will be apparent from the description, or may be learned by practice of the inventive concepts.

According to one or more embodiments, a pixel includes a first transistor, a second transistor connected between a gate of the first transistor and a data line and including a gate connected to a first scan line, a third transistor connected between the gate of the first transistor and a first voltage line and including a gate connected to a second scan line, a fourth transistor connected between a first terminal of the first transistor and a second voltage line and including a gate connected to the second scan line, a fifth transistor connected between a second terminal of the first transistor and a third voltage line and including a gate connected to a control line, a first capacitor and a second capacitor connected in series between the gate of the first transistor and the third voltage line, and an organic light-emitting diode including an anode connected to the first terminal of the first transistor.

A first voltage supplied to the first voltage line may be lower than a third voltage supplied to the third voltage line.

The first terminal of the first transistor may be connected to a common terminal of the first capacitor and the second capacitor.

A timing at which a second scan signal supplied to the second scan line has a voltage of a first level turning on a transistor may precede a timing at which a first scan signal supplied to the first scan line has a voltage of the first level.

A period for which the second scan signal maintains the voltage of the first level may be longer than a period for which the first scan signal maintains the voltage of the first level.

During one frame, for a first period, a second scan signal supplied to the second scan line and a control signal supplied to a control line may have a voltage of a first level turning on a transistor, and a first scan signal supplied to the first scan line may have a voltage of a second level turning off a transistor, wherein, for a second period subsequent to the first period, the second scan signal may have the voltage of the first level, and the first scan signal and the control signal may have the voltage of the second level, wherein, for a third period subsequent to the second period, the first scan signal may have the voltage of the first level, and the second scan signal and the control signal may have the voltage of the second level, and wherein, for a fourth period subsequent to the third period, the control signal may have the voltage of the first level, and the first scan signal and the second scan signal may have the voltage of the second level.

For the first period, the third transistor, the fourth transistor, and the fifth transistor may be turned on, the gate of the first transistor may be initialized by a first voltage supplied through the first voltage line, and the anode of the organic light-emitting diode may be initialized by a second voltage supplied through the second voltage line.

For the second period, the fifth transistor may be turned off, the first transistor and the fourth transistor may be turned on, and thus, a threshold voltage of the first transistor may be compensated for.

For the third period, the second transistor is turned on, and a voltage corresponding to a data signal supplied through the data line may be supplied to the gate of the first transistor.

For the fourth period, the organic light-emitting diode may emit light due to the first transistor and the fifth transistor that are turned on.

According to one or more embodiments, a display apparatus includes a pixel part in which a plurality of pixels are arranged, a first scan driving circuit configured to supply a first scan signal and a second scan signal to the plurality of pixels, a second scan driving circuit configured to supply a control signal to the plurality of pixels, a data driving circuit configured to supply a data signal to the plurality of pixels, wherein the plurality of pixels each include a first transistor, a second transistor connected between a gate of the first transistor and a data line, the gate being connected to a first scan line, and the first scan signal being supplied to the first scan line, a third transistor connected between the gate of the first transistor and a first voltage line and including a gate connected to a second scan line, the second scan signal being supplied to the second scan line, a fourth transistor connected between a first terminal of the first transistor and a second voltage line and including a gate connected to the second scan line, a fifth transistor connected between a second terminal of the first transistor and a third voltage line and including a gate connected to a control line, the control signal being supplied to the control line, a first capacitor and a second capacitor connected in series between the gate of the first transistor and the third voltage line, and an organic light-emitting diode including an anode connected to the first terminal of the first transistor.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
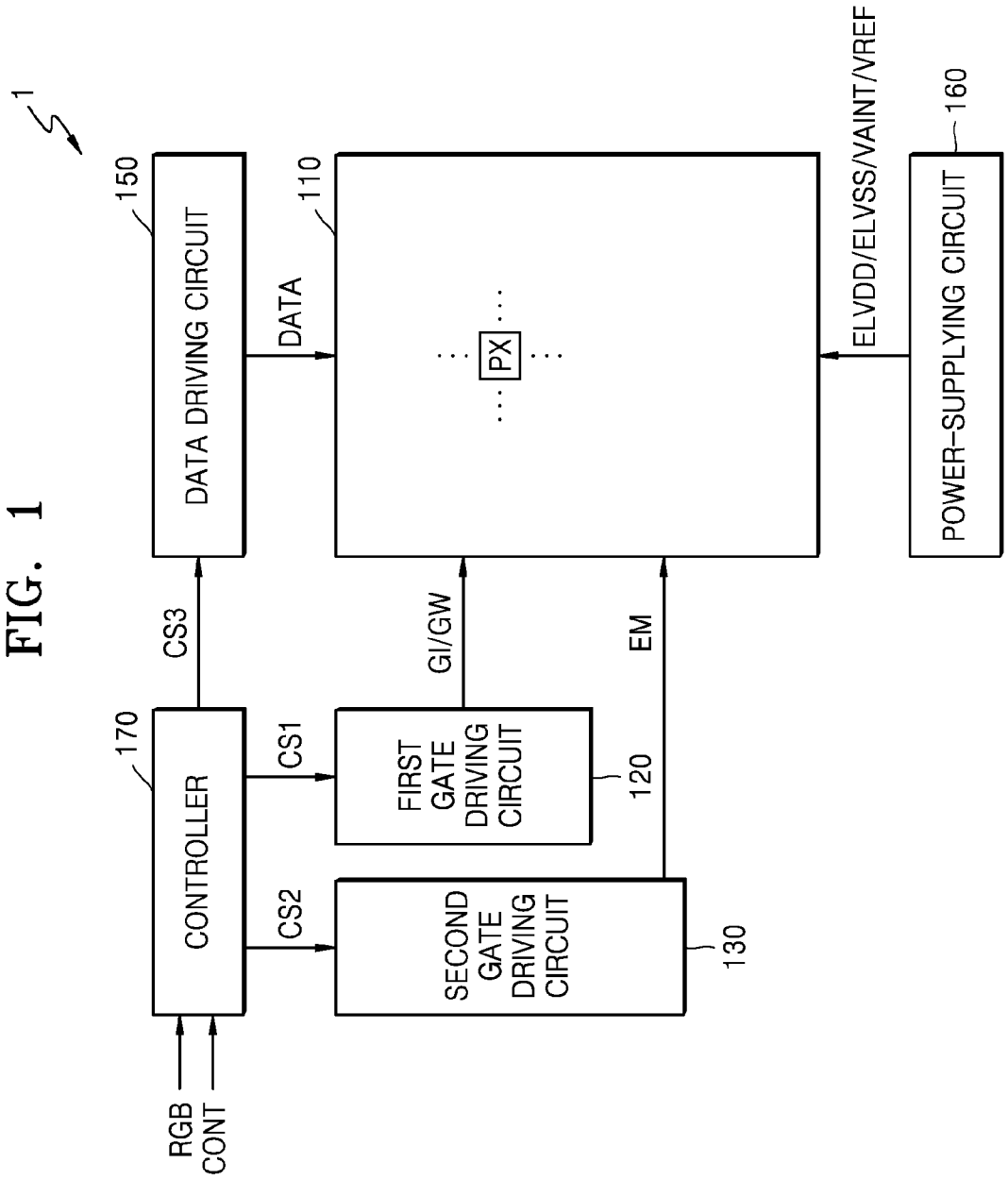
FIG. 1 is a view of a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the present specification, "A and/or B" denotes A or B, or A and B. In the present specification, "at least one of A and B" denotes A or B, or A and B.

As used herein, when a wiring is referred to as "extending in a first direction or a second direction," it denotes that the wiring not only extends in a straight line shape but also extends in a zigzag or in a curve in the first direction or the second direction.

As used herein, when an X is connected to a Y, it may denote that the X is electrically connected to the Y, that the X is functionally connected to the Y, and that the X is directly connected to the Y. Here, the X and the Y may be objects (e.g., apparatuses, devices, circuits, wirings, electrodes, terminals, conductive layers, layer, and the like). Accordingly, the connection is not limited to a preset connection relationship, for example, connection relationship shown in the drawings or described in the detailed description and may include others as well as the connection relationship shown in the drawings or described in the detailed description.

The case where the X is electrically connected to the Y may include, for example, the case where at least one device (e.g., a switch, a transistor, a capacitor device, an inductor, a resistor device a diode, and the like) enabling electrical connection of the X and the Y is connected between the X and the Y.

As used herein, "ON" used in associated with a device state may denote an activated state of the device, and "OFF" may denote an inactivated state of the device. "ON" used in associated with a signal received by a device may denote a signal activating the device, and "OFF" may denote a signal inactivating the device. An element may be activated by a high-level voltage or a low-level voltage. As an example, a P-channel transistor is activated by a low-level voltage, and an N-channel transistor is activated by a high-level voltage. It will be understood that on voltages with respect to a P-channel transistor and an N-channel transistor are opposite voltage levels (low and high).

FIG. 1 is a view of a display apparatus 1 according to an embodiment that is constructed according to principles of the invention.

Referring to FIG. 1, the display apparatus 1 according to an embodiment may include a pixel part 110, a first gate driving circuit 120, a second gate driving circuit 130, a data driving circuit 150, a power-supplying circuit 160, and a controller 170.

A plurality of pixels PX may be arranged in the pixel part 110. The plurality of pixels PX may be arranged in various configurations including a stripe arrangement, a pentile arrangement, a mosaic arrangement and the like to display images. The pixel part 110 may be arranged in a display area of a substrate. Each pixel PX may include an organic light-emitting diode OLED as a display element. The organic light-emitting diode OLED may be connected to a pixel circuit. Each pixel PX may emit, for example, red, green, blue, or white light from the organic light-emitting diode OLED.

A plurality of first scan lines, a plurality of second scan lines, and a plurality of emission control lines may be apart from each other regularly and arranged in rows in the pixel part 110. The first scan lines, the second scan lines, and the emission control lines may each extend in a first direction (e.g., a row direction) and be connected to the pixels PX on the same row. The first scan lines may be configured to respectively transfer first scan signals GI to the pixels PX on the same row. The second scan lines may be configured to respectively transfer second scan signals GW to the pixels PX on the same row. The emission control lines may be configured to respectively transfer emission control signals EM to the pixels PX on the same row. A plurality of data lines may be apart from each other regularly and arranged in columns in the pixel part 110. The data lines may each extend in a second direction (e.g., a column direction) and be connected to the pixels PX on the same column. The data lines may be configured to respectively transfer data signals DATA to the pixels PX on the same column.

The first gate driving circuit 120 may be connected to first scan lines and second scan lines of the pixel part 110 and configured to respectively transfer a first scan signal GW and a second scan signal GI to the first scan lines and the second scan lines. When a first scan signal GW and a second scan signal GI each have an "ON" signal, a transistor of a pixel PX connected to a corresponding scan line is turned on.

The second gate driving circuit 130 may be connected to the plurality of emission control lines of the pixel part 110 and configured to apply an emission control signal EM to the emission control lines according to a second control signal CS2.

The data driving circuit 150 may be connected to a plurality of data lines of the pixel part 110 and configured to apply a data signal DATA representing a grayscale to the data lines according to a third control signal CS3. The data driving circuit 150 may convert input image data into a data signal in the form of voltage or current, the input image data being input from the controller 170.

The power-supplying circuit 160 may generate voltages required for driving the pixel PX. As an example, the power-supplying circuit 160 may generate a first driving voltage ELVDD, a second driving voltage ELVSS, a reference voltage VREF, and an initialization voltage VAINT. The power-supplying circuit 160 may apply the first driving voltage ELVDD, the second driving voltage ELVSS, the reference voltage VREF, and the initialization voltage VAINT to the pixels PX of the pixel part 110.

The level of the first driving voltage ELVDD may be higher than the level of the second driving voltage ELVSS. The level of the reference voltage VREF may be lower than the level of the first driving voltage ELVDD. The initialization voltage VAINT may be a voltage by which the organic light-emitting diode OLED may be turned off. In an embodiment, the level of the initialization voltage VAINT may be lower than the level of the second driving voltage ELVSS. In another embodiment, the level of the initialization voltage VAINT may be higher than the level of the second driving voltage ELVSS. A difference between the level of the initialization voltage VAINT and the level of the second driving voltage ELVSS may be less than a threshold voltage required for a display element of the pixel PX to emit light.

The controller 170 may control the pixel part 110 by controlling operation timings of the first gate driving circuit 120, the second gate driving circuit 130, and the data driving circuit 150. The controller 170 may receive image data RGB and a control signal CONT controlling the displaying of the image data RGB from an external graphic controller. The control signal CONT may include, for example, at least one of a vertical synchronization signal Vsync, a horizontal synchronization signal Hsync, a data enable signal DE, and a clock signal CLK. The controller 170 may be configured to generate first to third control signals CS1, CS2, and CS3 according to a control signal CONT and transfer the first to third control signals CS1, CS2, and CS3 to the first gate driving circuit 120, the second gate driving circuit 130, and the data driving circuit 150, respectively.

The controller 170 may determine a frame period by counting a data enable signal DE. In this case, a vertical synchronization signal Vsync and a horizontal synchronization signal Hsync supplied from the outside may be omitted. The image data RGB includes luminance information of the pixels PX. Luminance may have the number of grayscales set in advance, for example, 1024 ($=2^{10}$), 256 ($=2^8$), or 64 ($=2^6$) grayscales.

Though it is shown in FIG. 1 that the first gate driving circuit 120 and the second gate driving circuit 130 are separate gate driving circuits, the first gate driving circuit 120 and the second gate driving circuit 130 may be implemented as one gate driving circuit to output a first scan signal GW, a second scan signal GI, and an emission control signal EM in another embodiment.

The first gate driving circuit 120, the second gate driving circuit 130, the data driving circuit 150, the power-supplying circuit 160, and the controller 170 may be respectively provided in the form of separate integrated circuit chips or be provided in the form of one integrated circuit chip, and directly mounted on a substrate on which the pixel part 110 is formed, mounted on a flexible printed circuit film, attached in the form of a tape carrier package (TCP) on the substrate, or directly formed on the substrate.

Figure 2:
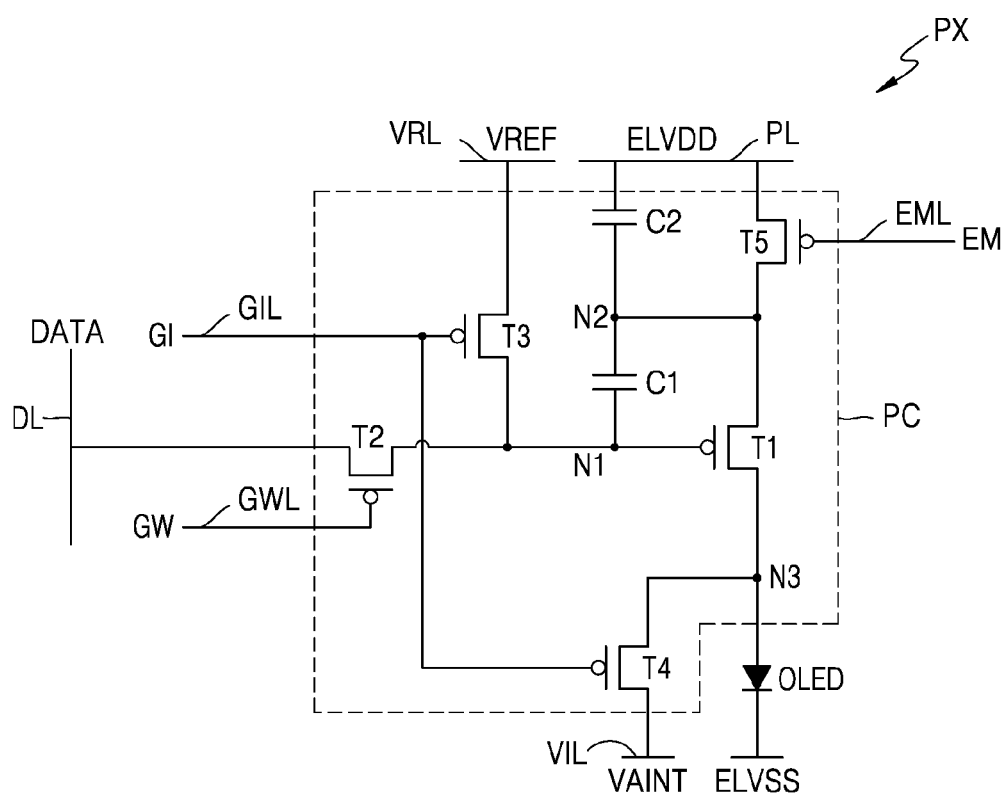
FIG. 2 is a view of a pixel circuit of a pixel according to an embodiment.

FIG. 2 is a view of a pixel circuit of a pixel according to an embodiment.

Referring to FIG. 2, the pixel PX may include an organic light-emitting diode OLED as a display element, and a pixel circuit PC connected to the organic light-emitting diode OLED. The pixel circuit PC may include first to fifth transistors T1, T2, T3, T4, and T5, and first and second capacitors C1 and C2. The first transistor T1 may be a driving transistor in which the amount of a source-drain current is determined according to a gate-source voltage. The second to fifth transistors T2, T3, T4, and T5 may be switching transistors that are turned on/off according to a gate-source voltage, substantially a gate voltage. The first to fifth transistors T1, T2, T3, T4, and T5 may be implemented as thin-film transistors. A first terminal of each of the first to fifth transistors T1, T2, T3, T4, and T5 may be a source or a drain, and a second terminal may be a terminal different from the first terminal depending on the kind (p-type or n-type) of a transistor and/or an operation condition. As an example, in the case where the first terminal is a source, the second terminal may be a drain.

The pixel PX may be connected to a first scan line GWL, a second scan line GIL, an emission control line EL, and a data line DL, the first scan line GWL being configured to transfer a first scan signal GW, the second scan line GIL being configured to transfer a second scan signal GI, the emission control line EML being configured to transfer an emission control signal EM, and the data line DL being configured to transfer a data signal DATA. A driving voltage line PL may be configured to transfer the first driving voltage ELVDD to the first transistor T1. An initialization voltage line VIL may be configured to transfer the initialization voltage VAINT to the organic light-emitting diode OLED. A reference voltage line VRL may be configured to transfer a reference voltage VREF to a gate of the first transistor T1.

The first transistor T1 includes the gate, a first terminal, and a second terminal, the gate being connected to a first node N1, the first terminal being connected to a second node N2, and the second terminal being connected to a third node N3. The first terminal of the first transistor T1 may be connected to the driving voltage line PL through the fifth transistor T5, and the second terminal may be connected to a pixel electrode of the organic light-emitting diode OLED. The first transistor T1 serves as a driving transistor, receives a data signal DATA, and controls the amount of a driving current flowing through the organic light-emitting diode OLED according to a switching operation of the second transistor T2.

The second transistor T2 (a data-writing transistor) includes a gate, a first terminal, and a second terminal, the gate being connected to the first scan line GWL, the first terminal being connected to the data line DL, and the second terminal being connected to the first node N1 (or the gate of the first transistor T1). The second transistor T2 may be turned on according to a first scan signal GW transferred through the first scan line GWL and be configured to transfer a data signal DATA to the first node N1, the data signal DATA being transferred to the data line DL.

The third transistor T3 (a first initialization transistor) includes a gate, a first terminal, and a second terminal, the gate being connected to the second scan line GIL, the first terminal being connected to the reference voltage line VRL, and the second terminal being connected to the first node N1 (or the gate of the first transistor T1). The third transistor T3 may be turned on according to a second scan signal GI transferred through the second scan line GIL and be configured to transfer the reference voltage VREF to the first node N1, the reference voltage VREF being transferred through the reference voltage line VRL.

The fourth transistor T4 (a second initialization transistor) includes a gate, a first terminal, and a second terminal, the gate being connected to the second scan line GIL, the first terminal being connected to the third node N3 (or the second terminal of the first transistor T1), and the second terminal being connected to the initialization voltage line VIL. The fourth transistor T4 may be turned on according to a second scan signal GI transferred through the second scan line GIL and be configured to transfer the initialization voltage VAINT to the third node N3, the initialization voltage VAINT being transferred through the initialization voltage line VIL.

The fifth transistor T5 (an emission control transistor) includes a gate, a first terminal, and a second terminal, the gate being connected to the emission control line EML, the first terminal being connected to the driving voltage line PL, and the second terminal being connected to the second node N2 (or the first terminal of the first transistor T1). The fifth transistor T5 may be turned on according to an emission control signal EM, and a current flows through the organic light-emitting diode OLED, the emission control signal EM being transferred through the emission control line EML.

The first and second capacitors C1 and C2 may be connected in series between the first node N1 and the driving voltage line PL. The first capacitor C1 may be connected between the first node N1 and the second node N2. The second capacitor C2 may be connected between the second node N2 and the driving voltage line PL. The second node N2, which is a common terminal of the first and second capacitors C1 and C2, may be connected to the second terminal of the first transistor T1 and the second terminal of the fifth transistor T5. The first and second capacitors C1 and C2 may store a threshold voltage of the first transistor T1 and a voltage corresponding to a data signal. The capacitance of the first capacitor C1 may be greater than the capacitance of the second capacitor C2.

The organic light-emitting diode OLED may include a pixel electrode (an anode) and an opposite electrode (a cathode), the opposite electrode facing the pixel electrode. The opposite electrode may receive the second driving voltage ELVSS. The opposite electrode may be a common electrode that is common over the plurality of pixels PX.

Though it is shown in FIG. 2 that the first to fifth transistors T1, T2, T3, T4, and T5 of the pixel circuit PC are P-type transistors, the embodiment is not limited thereto. As an example, various embodiments may be made, such as the transistors of the pixel circuit PC may be N-type transistors, or some of the transistors may be P-type transistors and the others may be N-type transistors.

Figure 3:
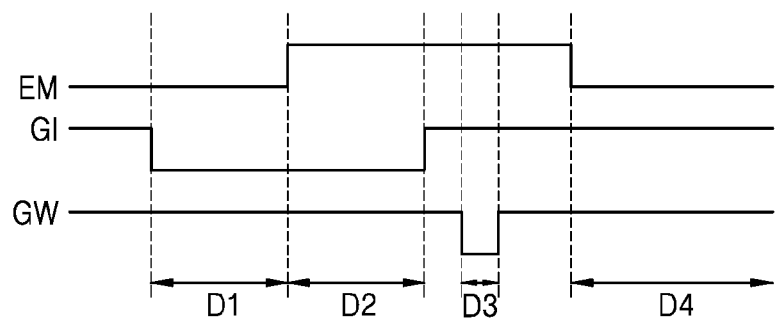
FIG. 3 is a timing diagram of control signals for operating the pixel circuit shown in FIG. 2.

FIG. 3 is a timing diagram of control signals for operating the pixel circuit shown in FIG. 2. Hereinafter, description is made with reference to FIGS. 2 and 3.

The pixel PX may divisionally operate from first to fourth periods D1, D2, D3, and D4 during one frame.

A second scan signal GI may be supplied as an on voltage for the first period D1 and the second period D2. A first scan signal GW may be supplied as an on voltage for the third period D3. That is, the period for which a second scan signal GI has an on voltage may precede the period for which a first scan signal GW has an on voltage. In addition, the period (a pulse width) for which a second scan signal GI has an on voltage may be longer than the period (a pulse width) for which a first scan signal GW has an on voltage. An emission control signal EM may be supplied as an off voltage for the second period D2 and the third period D3, and supplied as an on voltage for the first period D1 and the fourth period D4. A pulse width of the emission control signal EM may be a period for which a signal has an off voltage. Here, an on voltage is a turn-on voltage of a transistor and may be a low-level voltage.

The first driving voltage ELVDD may be supplied from the driving voltage line PL, the reference voltage VREF may be supplied from the reference voltage line VRL, and the initialization voltage VAINT may be supplied from the initialization voltage line VIL.

The first period D1 may be an initialization period for which the first node N1 connected to the gate of the first transistor T1, and the third node N3 connected to the pixel electrode (the anode) of the organic light-emitting diode OLED are initialized.

For the first period D1, a second scan signal GI of an on voltage may be supplied through the second scan line GIL, and an emission control signal EM of an on voltage may be supplied through the emission control line EML. A first scan signal GW may be provided as an off voltage. The third transistor T3 and the fourth transistor T4 may be turned on according to a second scan signal GI. The fifth transistor T5 may be turned on according to an emission control signal EM.

The third transistor T3 may be turned on and the reference voltage VREF may be supplied to the first node N1, that is, the gate of the first transistor T1. The fifth transistor T5 may be turned on and the first driving voltage ELVDD may be supplied to the first terminal of the first transistor T1. Accordingly, the first transistor T1 may be turned on. In addition, the fourth transistor T4 may be turned on, and the third node N3, that is, the pixel electrode of the organic light-emitting diode OLED, may be set to the initialization voltage VAINT. Accordingly, a capacitor formed parasitic on the organic light-emitting diode OLED may be discharged, and thus, the organic light-emitting diode OLED may be initialized.

The second period D2 may be a compensation period for which the threshold voltage of the first transistor T1 is compensated for. For the second period D2, a first scan signal GW may maintain an off voltage, a second scan signal GI may maintain an on voltage, and an emission control signal EM may transit to an off voltage.

For the second period D2, a second scan signal GI of an on voltage may be supplied through the second scan line GIL to turn on the third transistor T3 and the fourth transistor T4, and an emission control signal EM of an off voltage may be supplied through the emission control line EML to turn off the fifth transistor T5. Accordingly, when a current flows from the second node N2 to the initialization voltage line VIL through the first transistor T1 and the fourth transistor T4, and the voltage of the first terminal of the first transistor T1 drops below a difference VREF-Vth between the reference voltage VREF and a threshold voltage Vth of the first transistor T1, the first transistor T1 may be turned off. In addition, the first capacitor C1 may be charged with a voltage corresponding to the threshold voltage Vth of the first transistor T1.

The third period D3 may be a data-writing period for which a data signal is supplied to the pixel. For the third period D3, a second scan signal GI may transit to an off voltage, and an emission control signal EM may maintain an off voltage, and a first scan signal GW may transit to an on voltage. An on voltage of a first scan signal GW may have a width of an approximately horizontal scanning period 1H.

For the third period D3, a first scan signal GW of an on voltage may be supplied through the first scan line GWL to turn on the second transistor T2. In this case, a second scan signal GI and an emission control signal EM may be supplied as off voltages to turn off the third to fifth transistors T3, T4, and T5.

The second transistor T2 may be configured to transfer a data signal DATA to the first node N1, that is, the gate of the first transistor T1, the data signal DATA being from the data line DL. Accordingly, the voltage of the first node N1 may be changed from the reference voltage VREF to a voltage VDATA corresponding to a data signal DATA. In this case, the voltage of the second node N2 may be changed according to the amount of change in the voltage of the first node N1. As an example, the voltage of the second node N2 may be changed to a voltage VREF−Vth+Vk (Vk={(VDATA−VREF)×C1/(C1+C2)}) corresponding to a capacitance ratio of the first capacitor C1 and the second capacitor C2. Accordingly, the first capacitor C1 may be charged with a voltage VDATA corresponding to the threshold voltage Vth of the first transistor T1 and a data signal DATA.

The fourth period D4 may be an emission period for which the organic light-emitting diode OLED emits light. For the fourth period D4, an emission control signal EM may transit to an on voltage, and a first scan signal GW may transition to an off voltage.

For the fourth period D4, a first scan signal GW and a second scan signal GI may be supplied as off voltages, and an emission control signal EM may be supplied as an on voltage. Accordingly, the second to fourth transistors T2, T3, and T4 may be turned off and the fifth transistor T5 may be turned on, and thus, the first driving voltage ELVDD may be supplied to the second node N2.

The first transistor T1 may output a driving current Id ($\propto$(Vgs−Vth)$^2$) and the organic light-emitting diode OLED may emit light at brightness corresponding to the amount of the driving current Id regardless of the threshold voltage Vth of the first transistor T1, the driving current Id having an amount corresponding to a voltage Vgs−Vth obtained by subtracting the threshold voltage Vth of the first transistor T1 from a gate-source voltage Vgs(=VDATA−VREF+Vth−Vk) of the first transistor T1.

An embodiment may secure sufficient compensation time by separating an operation of compensating for the threshold voltage of the first transistor T1 and an operation of writing a data signal DATA to the pixel PX. Accordingly, image quality may be improved even when the display apparatus is driven at high speeds.

In addition, an embodiment may improve a yield and integration by reducing the number of transistors and the number of wirings constituting the pixel circuit.

An embodiment may provide a pixel that may emit light regardless of a threshold voltage of a driving transistor and a display apparatus including the pixel.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A pixel comprising:
a first transistor having a gate connected to a first node;
a second transistor having a first terminal connected to the first node, a second terminal connected to a data line, and a gate connected to a first scan line;
a third transistor having a first terminal connected to the first node, a second terminal connected to a first voltage line, and a gate connected to a second scan line;
a fourth transistor connected between a first terminal of the first transistor and a second voltage line and that includes a gate connected to the second scan line;
a fifth transistor connected between a second terminal of the first transistor and a third voltage line and that includes a gate connected to a control line;
a first capacitor and a second capacitor connected in series between the gate of the first transistor and the third voltage line; and
an organic light-emitting diode that includes an anode connected to the first terminal of the first transistor.

2. The pixel of claim 1, wherein a first voltage supplied to the first voltage line is lower than a third voltage supplied to the third voltage line.

3. The pixel of claim 1, wherein the first terminal of the first transistor is connected to a common terminal of the first capacitor and the second capacitor.

4. The pixel of claim 1, wherein a timing at which a second scan signal supplied to the second scan line has a voltage of a first level turning on a transistor precedes a timing at which a first scan signal supplied to the first scan line has a voltage of the first level by a first delay period.

5. The pixel of claim 4, wherein a period for which the second scan signal maintains the voltage of the first level is longer than a period for which the first scan signal maintains the voltage of the first level.

6. The pixel of claim 1, wherein, during one frame, for a first period, a second scan signal supplied to the second scan line and a control signal supplied to a control line have a voltage of a first level turning on a transistor, and a first scan signal supplied to the first scan line has a voltage of a second level turning off a transistor,
wherein, for a second period subsequent to the first period, the second scan signal has the voltage of the first level, and the first scan signal and the control signal have the voltage of the second level,
wherein, for a third period subsequent to the second period, the first scan signal has the voltage of the first level, and the second scan signal and the control signal have the voltage of the second level, and
wherein, for a fourth period subsequent to the third period, the control signal has the voltage of the first level, and the first scan signal and the second scan signal have the voltage of the second level.

7. The pixel of claim 6, wherein, for the first period, the third transistor, the fourth transistor, and the fifth transistor are turned on, the gate of the first transistor is initialized by a first voltage supplied through the first voltage line, and the anode of the organic light-emitting diode is initialized by a second voltage supplied through the second voltage line.

8. The pixel of claim 6, wherein, for the second period, the fifth transistor is turned off, the first transistor and the fourth transistor are turned on, and a threshold voltage of the first transistor is compensated for as a result thereof.

9. The pixel of claim 6, wherein, for the third period, the second transistor is turned on, and a voltage corresponding to a data signal supplied through the data line is supplied to the gate of the first transistor.

10. The pixel of claim 6, wherein the organic light-emitting diode emits light due to the first transistor and the fifth transistor that are turned on for the fourth period.

11. A display apparatus comprising:
a pixel part in which a plurality of pixels are arranged;
a first scan driving circuit configured to supply a first scan signal and a second scan signal to the plurality of pixels;
a second scan driving circuit configured to supply a control signal to the plurality of pixels;
a data driving circuit configured to supply a data signal to the plurality of pixels,
wherein the plurality of pixels each include:
a first transistor having a gate connected to a first node;
a second transistor having a first terminal connected to the first node, a second terminal connected to a data line, and a gate connected to a first scan line, and the first scan signal being supplied to the first scan line;
a third transistor having a first terminal connected to the first node, a second terminal connected to a first voltage line, and a gate connected to a second scan line, the second scan signal being supplied to the second scan line;

a fourth transistor connected between a first terminal of the first transistor and a second voltage line and that includes a gate connected to the second scan line;

a fifth transistor connected between a second terminal of the first transistor and a third voltage line and that includes a gate connected to a control line, the control signal being supplied to the control line;

a first capacitor and a second capacitor connected in series between the gate of the first transistor and the third voltage line; and an organic light-emitting diode that includes an anode connected to the first terminal of the first transistor.

12. The display apparatus of claim 11, wherein a first voltage supplied to the first voltage line is lower than a third voltage supplied to the third voltage line.

13. The display apparatus of claim 11, wherein the first terminal of the first transistor is connected to a common terminal of the first capacitor and the second capacitor.

14. The display apparatus of claim 11, wherein a period at which a second scan signal supplied to the second scan line has a voltage of a first level turning on a transistor precedes a period at which a first scan signal supplied to the first scan line has a voltage of the first level by a first delay period.

15. The display apparatus of claim 14, wherein a period for which the second scan signal has the voltage of the first level is longer than a period for which the first scan signal has the voltage of the first level.

16. The display apparatus of claim 11, wherein, during one frame, for a first period, a second scan signal supplied to the second scan line and a control signal supplied to a control line have a voltage of a first level turning on a transistor, and a first scan signal supplied to the first scan line has a voltage of a second level turning off a transistor, wherein, for a second period subsequent to the first period, the second scan signal has the voltage of the first level, and the first scan signal and the control signal have the voltage of the second level, wherein, for a third period subsequent to the second period, the first scan signal has the voltage of the first level, and the second scan signal and the control signal have the voltage of the second level, and wherein, for a fourth period subsequent to the third period, the control signal has the voltage of the first level, and the first scan signal and the second scan signal have the voltage of the second level.

17. The display apparatus of claim 16, wherein, for the first period, the first transistor, the third transistor, the fourth transistor, and the fifth transistor are turned on, the gate of the first transistor is initialized by a first voltage supplied through the first voltage line, and the anode of the organic light-emitting diode is initialized by a second voltage supplied through the second voltage line.

18. The display apparatus of claim 16, wherein, for the second period, the fifth transistor is turned off, the first transistor and the fourth transistor are turned on, and a threshold voltage of the first transistor is compensated for as a result thereof.

19. The display apparatus of claim 16, wherein, for the third period, the second transistor is turned on, and a voltage corresponding to a data signal supplied through the data line is supplied to the gate of the first transistor.

20. The display apparatus of claim 16, wherein the organic light-emitting diode emits light due to the first transistor and the fifth transistor that are turned on for the fourth period.

* * * * *